US012588544B2

(12) United States Patent
Chen et al.

(10) Patent No.: US 12,588,544 B2
(45) Date of Patent: Mar. 24, 2026

(54) PACKAGING STRUCTURE AND PACKAGING METHOD

(71) Applicant: SJ Semiconductor(Jiangyin) Corporation, Jiangyin City (CN)

(72) Inventors: Yenheng Chen, Jiangyin City (CN); Chengchung Lin, Jiangyin City (CN)

(73) Assignee: SJ Semiconductor(Jiangyin) Corporation, JiangSu Province (CN)

( * ) Notice: Subject to any disclaimer, the term of this patent is extended or adjusted under 35 U.S.C. 154(b) by 391 days.

(21) Appl. No.: 18/132,295

(22) Filed: Apr. 7, 2023

(65) Prior Publication Data

US 2023/0335453 A1    Oct. 19, 2023

(30) Foreign Application Priority Data

Apr. 15, 2022    (CN) .......................... 202210397711.1

(51) Int. Cl.
| | |
|---|---|
| *H01L 21/56* | (2006.01) |
| *H01L 23/00* | (2006.01) |
| *H01L 23/31* | (2006.01) |
| *H01Q 1/38* | (2006.01) |
| *H01Q 1/40* | (2006.01) |

(52) U.S. Cl.
CPC ........ *H01L 23/3128* (2013.01); *H01L 21/568* (2013.01); *H01L 24/19* (2013.01); *H01L 24/20* (2013.01); *H01Q 1/38* (2013.01); *H01Q 1/40* (2013.01); *H01L 2224/19* (2013.01); *H01L 2224/21* (2013.01)

(58) Field of Classification Search
None
See application file for complete search history.

(56) References Cited

U.S. PATENT DOCUMENTS

| | | | |
|---|---|---|---|
| 2020/0058604 A1* | 2/2020 | Chen | .................... H01L 23/5385 |
| 2022/0254741 A1* | 8/2022 | Chen | .................... H01Q 1/2283 |

* cited by examiner

*Primary Examiner* — Jay C Chang
(74) *Attorney, Agent, or Firm* — IPRTOP LLC

(57) ABSTRACT

A packaging structure comprising a first antenna layer on a protective layer, a dielectric layer, a first plastic packaging layer over the first antenna layer, a second conductive pillar, a chip, a redistribution layer, and a second plastic packaging layer, the first conductive pillar is electrically connected to the first antenna layer, the dielectric layer is formed over the first conductive pillar, the second antenna layer is electrically connected to the first conductive pillar, the second conductive pillar is formed over the dielectric layer and electrically connected to the second antenna layer, the chip layer is formed over the dielectric layer, the redistribution layer is provided with conductive bumps and electrically connected to the chip and the second antenna layer, and the second plastic packaging layer encapsulates the second antenna layer and the chip. Chip and multiple antennas are packaged with one carrier substrate, reducing size.

8 Claims, 3 Drawing Sheets

| | |
|---|---|
| forming an adhesion layer over a carrier substrate, and forming a protective layer over the adhesion layer | S1 |

| | |
|---|---|
| forming a first antenna layer over the protective layer, wherein the first antenna layer comprises at least one first antenna unit, and forming a first conductive pillar over the first antenna unit, wherein the first conductive pillar is electrically connected to the first antenna unit | S2 |

| | |
|---|---|
| forming a first plastic packaging layer on top of the protective layer, the first antenna layer, and the first conductive pillar, forming a dielectric layer over the first plastic packaging layer, forming a second antenna layer in the dielectric layer, and forming a second conductive pillar electrically connected to the second antenna layer | S3 |

| | |
|---|---|
| attaching at least one chip to the dielectric layer to form a chip layer, wherein a side of the chip facing away from the carrier substrate is provided with electrodes, and forming a second plastic packaging layer on the dielectric layer, the second conductive pillar, the chip layer, and the electrodes | S4 |

| | |
|---|---|
| forming a redistribution layer over the second plastic packaging layer, wherein the redistribution layer comprises at least one medium layer and at least one conductive interconnection layer, and the redistribution layer is electrically connected to the second conductive pillar and the electrodes, and forming conductive bumps over the redistribution layer, wherein the conductive bumps electrically connect to the conductive interconnection layer | S5 |

FIG. 1

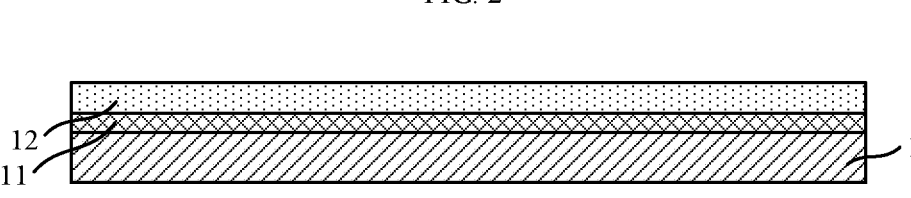

PACKAGING STRUCTURE AND PACKAGING METHOD

CROSS REFERENCE TO RELATED APPLICATION

The present application claims the benefit of priority to Chinese Patent Application No. CN 202210397711.1, entitled "packaging structure and packaging method", filed with CNIPA on Apr. 15, 2022, the disclosure of which is incorporated herein by reference in its entirety for all purposes.

FIELD OF TECHNOLOGY

The present disclosure generally relates to integrated circuit manufacturing, in particular, to a packaging structure and a packaging method.

BACKGROUND

Antenna-in-Package (AiP) is a technology that integrates antennas and chips in one package to realize system-level wireless functions. The AiP technology provides a good antenna packaging solution for system-level wireless chips because it facilitates integration of silicon-based semiconductor process. Also, the AiP technology has become indispensable for developing 5th-Generation (5G) communication chips and automotive radar chips.

At present, transmission and reception of signals by antennas requires an antenna module, a filter module, a low-noise amplifier module, a power amplifier module, and a RF transceiver, which are usually assembled together on a printed circuit board (PCB), resulting in a large package size, a long signal transmission path, and a high signal loss when transmitting 5G millimeter waves. During the assembly, a carrier substrate is used for multiple times, complicating the process.

Therefore, there is an urgent need to develop an antenna package with a smaller size, a shorter signal transmission path, a lower signal loss, and also easier to manufacture than current packages.

SUMMARY

The present disclosure provides a packaging method, comprising: forming an adhesion layer over a carrier substrate, and forming a protective layer over the adhesion layer; forming a first antenna layer over the protective layer, wherein the first antenna layer comprises at least one first antenna unit, and forming a first conductive pillar over the first antenna unit, wherein the first conductive pillar is electrically connected to the first antenna unit; forming a first plastic packaging layer on top of the protective layer, the first antenna layer, and the first conductive pillar, forming a dielectric layer over the first plastic packaging layer, forming a second antenna layer in the dielectric layer, and forming a second conductive pillar electrically connected to the second antenna layer; attaching at least one chip to the dielectric layer to form a chip layer, wherein a side of the chip facing away from the carrier substrate is provided with electrodes, and forming a second plastic packaging layer on the dielectric layer, the second conductive pillar, the chip layer, and the electrodes; and forming a redistribution layer over the second plastic packaging layer, wherein the redistribution layer comprises at least one medium layer and at least one conductive interconnection layer, and the redistribution layer is electrically connected to the second conductive pillar and the electrodes, and forming conductive bumps over the redistribution layer, with conductive bumps electrically connected to the conductive interconnection layer.

The present disclosure also provides a packaging structure, comprising: a protective layer; a first antenna layer formed over the protective layer, wherein the first antenna layer comprises at least one first antenna unit, wherein a first conductive pillar is formed over the first antenna layer and is electrically connected to the first antenna unit; a dielectric layer, formed over the first conductive pillar, wherein a second antenna layer is formed inside the dielectric layer, and wherein the second antenna layer is electrically connected to the first conductive pillar; a first plastic packaging layer, formed between the protective layer and the dielectric layer, wherein the first plastic packaging layer covers the first antenna layer and side walls of the first conductive pillar; a second conductive pillar, formed over the dielectric layer, wherein the second conductive pillar is electrically connected to the second antenna layer; a chip layer, formed over the dielectric layer, wherein the chip layer comprises at least one chip, wherein a side of the chip facing away from the carrier substrate is provided with electrodes; a redistribution layer, formed over and electrically connected to the second conductive pillar and the chip layer, wherein the redistribution layer comprises at least one medium layer and at least one conductive interconnection layer, and wherein conductive bumps are formed over the redistribution layer and are electrically connected to the conductive interconnection layer; and a second plastic packaging layer, formed between the dielectric layer and the redistribution layer, and wherein the second plastic packaging layer are configured to be on the chip layer and side walls of the second conductive pillar.

BRIEF DESCRIPTION OF THE DRAWINGS

FIG. 1 shows a flow chart of a packaging method of the present disclosure.

FIG. 2 shows a schematic cross-sectional view of a carrier substrate used in a packaging method of the present disclosure.

FIG. 3 shows a schematic cross-sectional view of an intermediate structure obtained after forming an adhesion layer and a protective layer over a carrier substrate.

REFERENCE NUMERALS

Figure 4:
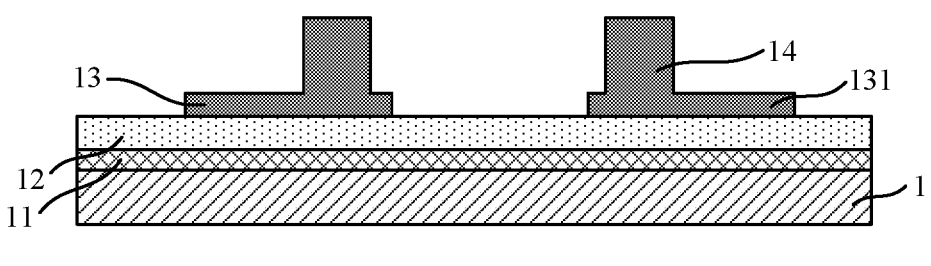
FIG. 4 shows a schematic cross-sectional view of an intermediate structure obtained after forming a first antenna layer and a first conductive pillar at one side of the protective layer facing away from the carrier substrate.

1 Carrier substrate
11 Adhesion layer
12 Protective layer
13 First antenna layer
131 First antenna unit
14 First conductive pillar
15 First plastic packaging layer
2 Dielectric layer
21 Second antenna layer
211 Second antenna unit
22 Second conductive pillar
23 Chip layer
231 Electrode
24 Second plastic packaging layer
25 Redistribution layer
251 Medium layer
252 Conductive interconnection layer
26 Conductive bumps
27 First conductive plug

DETAILED DESCRIPTION

The following describes the implementation of the present disclosure through specific examples, and those skilled in the art can easily understand other advantages and effects of the present disclosure from the content disclosed in this specification. The present disclosure can also be implemented or applied through other different specific embodiments. Various details in this specification can also be modified or changed based on different viewpoints and applications without departing from the spirit of the present disclosure.

Referring to FIGS. 1 to 10. It should be noted that the drawings provided in this disclosure only illustrate the basic concept of the present disclosure in a schematic way, so the drawings only show the components related to the present disclosure. The drawings are not necessarily drawn according to the number, shape, and size of the components in actual implementation; during the actual implementation, the type, quantity, and proportion of each component can be changed as needed, and the components' layout may also be more complicated.

Embodiment 1

The present disclosure provides a packaging method, as shown in FIG. 1, which is a flow chart of the packaging method; the method comprises operations S1-S5.

S1: forming an adhesion layer over a carrier substrate, and forming a protective layer over the adhesion layer;

S2: forming a first antenna layer over the protective layer, wherein the first antenna layer comprises at least one first antenna unit, and forming a first conductive pillar over the first antenna unit, wherein the first conductive pillar is electrically connected to the first antenna unit;

S3: forming a first plastic packaging layer at least partially covering the protective layer, the first antenna layer, and the first conductive pillar, forming a dielectric layer over the first plastic packaging layer, forming a second antenna layer in the dielectric layer, and forming a second conductive pillar electrically connected to the second antenna layer;

S4: attaching at least one chip to the dielectric layer to form a chip layer, wherein a side of the chip facing away from the carrier substrate is provided with electrodes, and forming a second plastic packaging layer at least partially covering the dielectric layer, the second conductive pillar, the chip layer, and the electrodes; and S5: forming a redistribution layer over the second plastic packaging layer, wherein the redistribution layer comprises at least one medium layer and at least one conductive interconnection layer, and the redistribution layer is electrically connected to the second conductive pillar and the electrodes, and forming conductive bumps over the redistribution layer, with conductive bumps electrically connected to the conductive interconnection layer.

Referring to FIGS. 2 to 3, step S1 is first performed, which comprises: providing the carrier substrate 1, forming the adhesion layer 11 over the carrier substrate 1, and forming the protective layer 12 over the adhesion layer 11.

As an example, a schematic cross-sectional view of the carrier substrate 1 is shown in FIG. 2; the carrier substrate 1 may be circular, square, or in any other suitable shape. The material of the carrier substrate 1 comprises one of glass, ceramic, metal, organic polymer, and semiconductor, or another suitable material.

As shown in FIG. 3, the adhesion layer 11 is formed over the carrier substrate 1, wherein the adhesion layer may be obtained by applying a tape to the carrier substrate 1, or the adhesion layer may be obtained by coating the carrier substrate 1 with a polymer material and curing the coated material. The adhesion layer 11 can be dissolved by reducing its adhesion by laser irradiation, UV irradiation, or heat treatment.

As an example, the material of the protective layer 12 comprises at least one of polyimide, silicone, epoxy resin, and any other suitable materials.

As an example, the method of forming the protective layer 12 comprises one of the techniques of compression molding, transfer molding, liquid seal molding, vacuum lamination, and spin coating.

Referring to FIG. 4, step S2 comprises: forming the first antenna layer 13 over the protective layer 12, wherein the first antenna layer 13 comprises at least one first antenna unit 131, and forming the first conductive pillar 14 over the first antenna unit 131, wherein the first conductive pillar 14 is electrically connected to the first antenna unit 131;

As an example, the method of forming the first antenna layer 13 comprises at least one of the techniques of chemical vapor deposition, physical vapor deposition, vapor deposition, sputtering, electroplating, and chemical plating.

As an example, the material of the first antenna layer 13 comprises at least one of copper, aluminum, nickel, gold, silver, and titanium.

As an example, after forming the first antenna layer 13, excess materials of the first antenna layer are removed by dry etching, wet etching, or another suitable method to obtain the first antenna unit 131.

As an example, the method of forming the first antenna layer 14 comprises at least one of the techniques of chemical vapor deposition, physical vapor deposition, vapor deposition, sputtering, electroplating, and chemical plating.

Specifically, the material of the first conductive pillar 14 comprises at least one of copper, aluminum, nickel, gold, silver, and titanium.

As an example, the first conductive pillar 14 comprises a bottom surface and a top surface, and the first antenna unit 131 is electrically connected to the bottom surface of the first conductive pillar 14.

Figure 5:
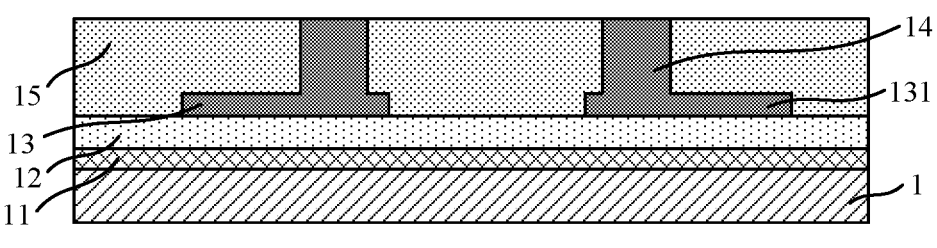
FIG. 5 shows a schematic cross-sectional view of an intermediate structure obtained after the formation of a first packaging layer.
Figure 6:
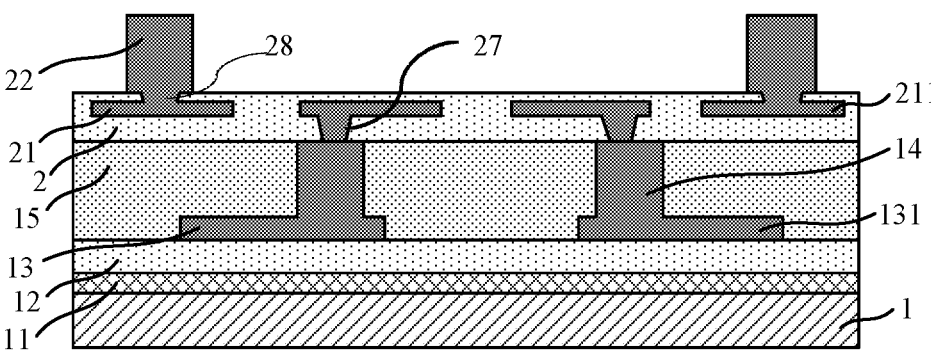
FIG. 6 shows a schematic cross-sectional view of an intermediate structure obtained after forming a dielectric layer, a second antenna layer and a second conductive pillar.

Referring to FIGS. 5 and 6, S3 comprises: forming the first plastic packaging layer 15 at least partially covering the protective layer 12, the first antenna layer 13, and the first conductive pillar 14, forming the dielectric layer 2 over the first plastic packaging layer 15, forming the second antenna layer 21 in the dielectric layer 2, and forming a second conductive pillar 22 electrically connected to the second antenna layer 21. In one example, the dielectric layer 2 serves as a buffer layer.

As an example, the material of the first plastic packaging layer 15 comprises at least one of polyimide, silicone, epoxy resin, and any other suitable materials.

As an example, the method of forming the first plastic packaging layer 15 comprises one of the techniques of compression molding, transfer molding, liquid seal molding, vacuum lamination, and spin coating.

As an example, as shown in FIG. 5, after forming the first plastic packaging layer 15 and before forming the dielectric layer 2, the first plastic packaging layer 15 is thinned to reveal a top surface of the first conductive pillar 14.

As an example, the method of thinning the first plastic packaging layer 15 comprises techniques of chemical-mechanical polishing or other suitable methods.

As an example, the material of the dielectric layer 2 comprises at least one of epoxy resin, silicone, polyimide, polybenzoxazoles, benzocyclobutene, silicon oxide, phosphor silica glass, fluorine containing glass, or other suitable insulating materials.

As an example, the method of forming the dielectric layer 2 comprises one of chemical vapor deposition, physical vapor deposition, and coating.

As an example, as shown in FIG. 6, after forming the dielectric layer 2, the second antenna layer 21 is formed over one side of the dielectric layer 2 farcing away from the carrier substrate 1.

As an example, the method of forming the second antenna layer 21 comprises at least one of the techniques of chemical vapor deposition, physical vapor deposition, vapor deposition, sputtering, electroplating, and chemical plating.

As an example, the material of the second antenna layer 21 comprises at least one of copper, aluminum, nickel, gold, silver, and titanium.

As an example, after forming the second antenna layer 21, excess materials of the second antenna layer are removed by dry etching, wet etching, or any other suitable method to obtain the second antenna unit 211.

As an example, before forming the second antenna layer 21, the method further comprises forming a first conductive plug 27 in the dielectric layer 2.

As an example, the method of forming the first conductive plug 27 comprises at least one of the techniques of chemical vapor deposition, physical vapor deposition, vapor deposition, sputtering, electroplating, and chemical plating.

As an example, the material of the first conductive plug comprises at least one of copper, aluminum, nickel, gold, silver, and titanium.

As an example, one end of the first conductive plug 27 is electrically connected to a bottom surface of the second antenna layer 21, and the other end of the first plug is electrically connected to a top surface of the first conductive pillar 14.

As an example, the second antenna unit 211 is electrically connected to the top surface of the first conductive pillar 14 by the first conductive plug 27.

As an example, after obtaining the second antenna unit 211, a second conductive plug 28 is formed in the dielectric layer 2 with one end of the second conductive plug electrically connected to the second antenna layer 21.

The other end of the second conductive plug 28 is exposed from a top surface of the dielectric layer 2.

As an example, the method of forming the second conductive plug 28 comprises at least one of chemical vapor deposition, physical vapor deposition, vapor deposition, sputtering, electroplating, and chemical plating.

As an example, the material of the second conductive plug 28 comprises at least one of copper, aluminum, nickel, gold, silver, and titanium.

As an example, after forming the second conductive plug 28, the second conductive pillar 22 is formed over the dielectric layer 2 and is electrically connected to the exposed end of the second conductive plug 28.

As an example, the material of the second conductive pillar 22 comprises at least one of copper, aluminum, nickel, gold, silver, and titanium.

As an example, the method of forming the second conductive pillar 22 comprises at least one of chemical vapor deposition, physical vapor deposition, vapor deposition, sputtering, electroplating, and chemical plating.

Figure 7:
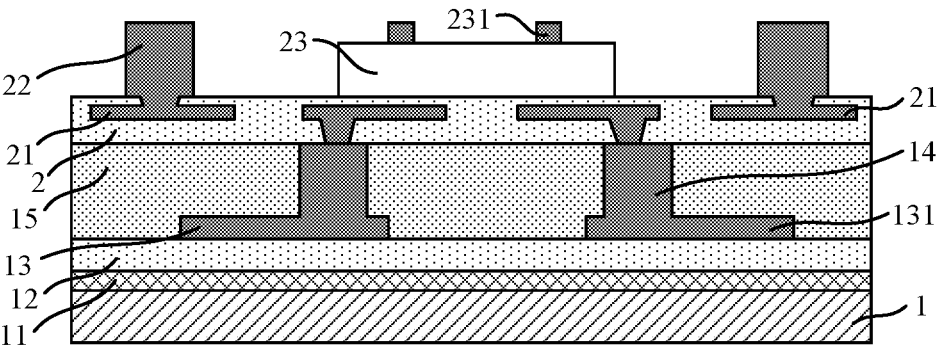
FIG. 7 shows a schematic cross-sectional view of an intermediate structure obtained after forming a chip layer.
Figure 8:
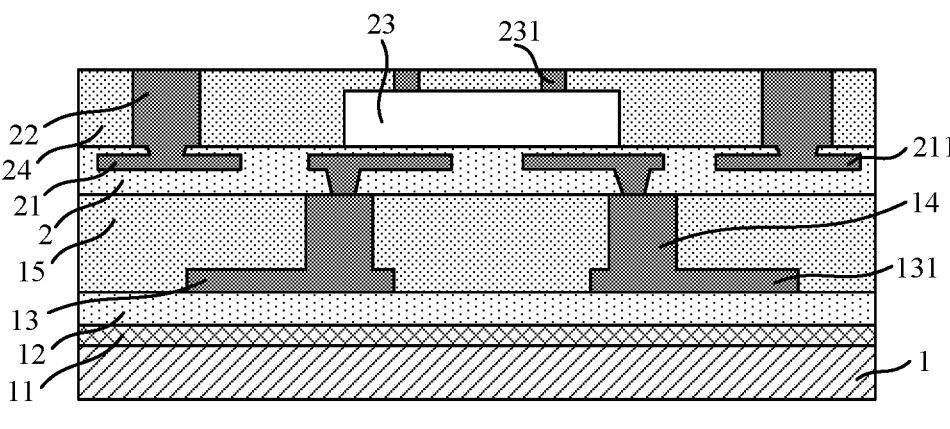
FIG. 8 shows a schematic cross-sectional view of an intermediate structure obtained after the formation of a second packaging layer.

Referring to FIGS. 7 to 8, S4 comprises: attaching at least one chip to the dielectric layer 2 to form the chip layer 23, wherein a side of the chip layer 23 facing away from the carrier substrate 1 is provided with electrodes 231, and forming the second plastic packaging layer 24 at least partially covering the dielectric layer 2, the second conductive pillar 22, the chip layer 23, and the electrodes 231. The chip may comprise one or more functional modules.

As an example, as shown in FIG. 7, the chip layer 23 is formed over a side of the dielectric layer 2 facing away from the carrier substrate 1, and the chip layer 23 is separated from the second antenna layer 21 by the dielectric layer 2.

As an example, the chip layer 23 is attached to the dielectric layer 2 using adhesive tape or any other suitable method, to secure the chip layer 23.

As an example, as shown in FIG. 8, the second plastic packaging layer 24 at least partially covering the dielectric layer 2, the second conductive pillar 22, the chip layer 23 and the electrodes 231 is formed by compression molding, transfer molding, liquid seal molding, vacuum lamination, spin coating, or any other suitable method; in an example, the second plastic packaging layer 24 is made of at least one of polyimide, silicone, and epoxy resin.

As an example, after forming the second plastic packaging layer 24 and before forming the redistribution layer, the second plastic packaging layer 24 is thinned to reveal a top surface of the second conductive pillar 22.

As an example, the method of thinning the second plastic packaging layer 24 comprises chemical-mechanical grinding or other suitable methods.

Figure 9:
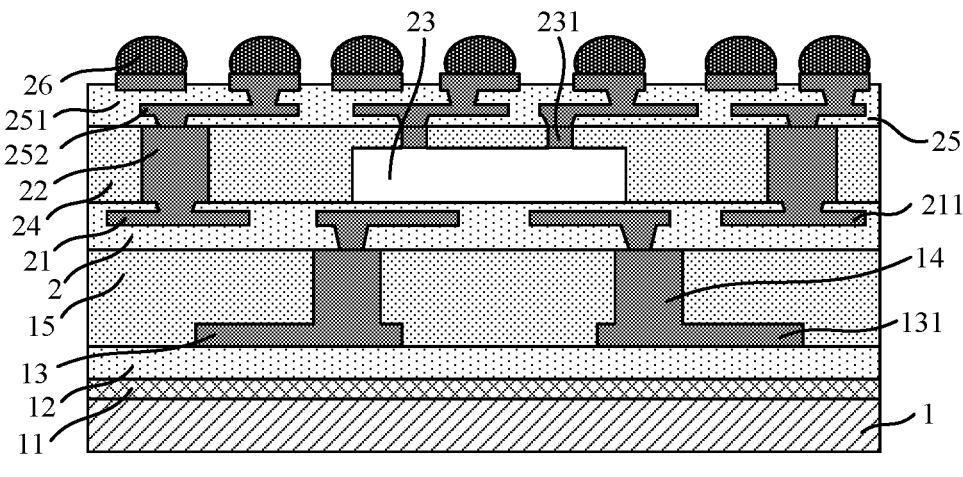
FIG. 9 shows a schematic cross-sectional view of an intermediate structure obtained after forming a redistribution layer, and conductive bumps.
Figure 10:
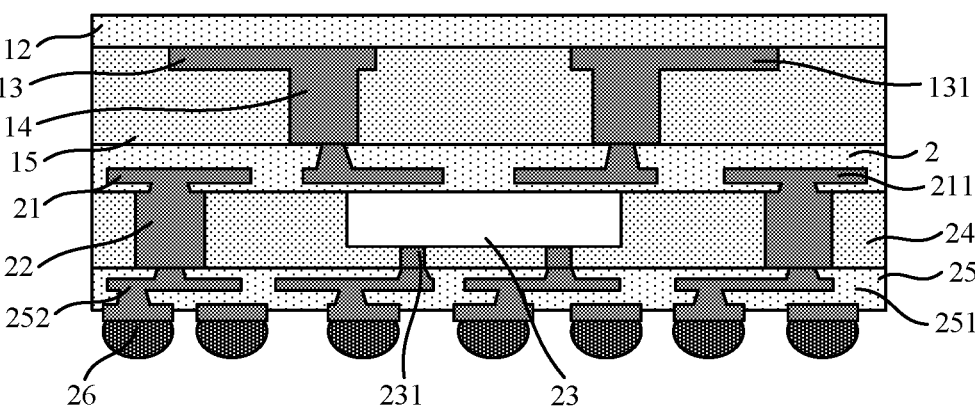
FIG. 10 shows a schematic cross-sectional view of a packaging structure according to one embodiment of the present disclosure.

Referring to FIGS. 9 to 10, S5 comprises: forming the redistribution layer 25 over the second plastic packaging layer 24, wherein the redistribution layer 25 comprises at least one medium layer 251 and at least one conductive interconnection layer 252, and the redistribution layer 25 is electrically connected to the second conductive pillar 22 and the electrodes 231, and forming conductive bumps 26 over the redistribution layer 25, with the conductive bumps 26 electrically connected to the conductive interconnection layer 25.

As an example, as shown in FIG. 9, the redistribution layer 25 is formed over a side of the second plastic packaging layer 24 facing away from the carrier substrate 1, wherein the method of forming the medium layer 251 comprises a chemical vapor deposition process, physical vapor deposition, coating, or other suitable method.

As an example, the material of the medium layer 251 comprises at least one of epoxy resin, silicone, polyimide, polybenzoxazoles, benzocyclobutene, silicon oxide, phosphor silica glass, fluorine containing glass, or other suitable materials.

As an example, the material of the conductive interconnection layer 252 comprises at least one of copper, aluminum, nickel, gold, silver, and titanium.

As an example, the method of forming the conductive interconnection layer 252 comprises at least one of chemical vapor deposition, physical vapor deposition, vapor deposition, sputtering, electroplating, and chemical plating.

As an example, there is at least one the medium layer 251 and at least one conductive interconnection layer 252, the number of the interconnection layers and the number of medium layers may be adjusted as needed; in one example, there are multiple medium layers 251 and conductive interconnection layers 252 stacked up over the second plastic packaging layer 24.

As an example, there are multiple conductive interconnection layers 252 formed in the redistribution layer 25, and the one closer to the carrier substrate 1 is electrically connected to a top surface of the second conductive pillar 22 and the electrodes 231.

As an example, the method of forming the conductive bumps 26 comprises one of the techniques of soldering, solder ball mounting, or any other suitable method.

As an example, the material of the conductive bumps 26 comprises at least one of copper, aluminum, nickel, gold, silver, and titanium.

As an example, as shown in FIG. 10, after forming the conductive bump 26, the method further comprises removing the adhesion layer 11 and the carrier substrate 1 to obtain an intermediate packaging structure, and cutting the intermediate packaging structure to obtain a plurality of final packaging structures.

As an example, removing the carrier substrate 1 and the adhesion layer 11 is performed by laser peeling.

The packaging method of the present disclosure comprises forming the adhesion layer 11, the protective layer 12, the first antenna layer 13 and the first conductive pillar 14 in sequence over the carrier substrate 1, encapsulating the first antenna layer 13 with the first plastic packaging layer 15, forming the dielectric layer 2 over the first plastic packaging layer 15, and forming the second antenna layer 21 in the dielectric layer 2, forming chip layer 23 over the dielectric layer 2, and using the second plastic packaging layer 24 to encapsulate the second antenna layer 21, and then forming the redistribution layer 25 to electrically connect the chip layer 23 and the second antenna layer 21; this method realizes an integrated package of multiple layers of antennas and chips by using one carrier substrate for only once, thereby reducing the packaging cost.

Embodiment 2

The present disclosure also provides a packaging structure; as shown in FIG. 10, which is a schematic cross-sectional view of the packaging structure, the packaging structure comprises a protective layer 12, a first antenna layer 13, a dielectric layer 2, a first plastic packaging layer 15, a second conductive pillar, a chip layer 23, a redistribution layer 25, and a second plastic packaging layer 24; the first antenna layer 13 is formed over the protective layer 12, the first antenna layer 13 comprises at least one first antenna unit 131, and the first antenna layer 13 is provided with a first conductive pillar 14 electrically connected to the first antenna unit 131; the dielectric layer 2 is formed over the first conductive pillar, and the dielectric layer 2 is provided with a second antenna layer 21 formed inside the dielectric layer 2, and the second antenna layer 21 is electrically connected to the first conductive pillar 14; the first packaging layer 15 is formed between the protective layer 12 and the dielectric layer 2, and at least partially covers the first antenna layer 13 and the first conductive pillar 14; the second conductive pillar 22 is formed over the dielectric layer 2 and is electrically connected to the second conductive pillar 21; the chip layer 23 is formed over the dielectric layer 2 and comprises at least one chip; the chip layer 23 is provided with electrodes 231 on a side of the chip layer 23 facing away from the protective layer 12; the redistribution layer 25 is formed over the second conductive pillar 22 and the chip layer 23, and is electrically connected to the second conductive pillar 22 and the chip layer 23; the redistribution layer 25 comprises at least one dielectric layer 251 and at least one conductive interconnection layer 252, and the redistribution layer 25 is provided with conductive bumps 26 electrically connected to the conductive interconnection layer 252; the second plastic packaging layer 24 is formed between the dielectric layer 2 and the redistribution layer 25, and at least partially covers the second conductive pillar 22 and the chip layer 23.

As an example, the protective layer 12 is used to protect the packaging structure, and prevent oxidation of the antenna layers.

As an example, a first conductive plug 27 and a second conductive plug 28, as shown in FIG. 6, are formed in the dielectric layer 2, the first conductive plug 27 is connected between the first conductive pillar 14 and the second antenna layer 21, and the second conductive plug 28 is connected between the second antenna layer 21 and the second conductive pillar 22.

As an example, one end of the first conductive plug 27 is electrically connected to a bottom surface of the second antenna layer 21, and the other end of the first plug is electrically connected to a top surface of the first conductive pillar 14.

As an example, one end of the second conductive plug 28 is electrically connected to a top surface of the second antenna layer 21, and the other end of the second conductive plug 28 is electrically connected to the first conductive pillar 22.

As an example, a top surface of the second conductive pillar 22 is electrically connected to the conductive interconnection layer 252 in the redistribution layer 25.

As an example, there can be multiple conductive interconnection layers 252 in the redistribution layer 25, and the top surface of the second conductive pillar 22 and the electrodes 231 are electrically connected to one of the conductive interconnection layers like 252 that is the furthest away from the conductive bumps 26.

As an example, the second antenna layer 21 comprises at least one second antenna unit 211.

As an example, the conductive bumps 26 are ball-shaped or pillar-shaped.

As an example, the packaging structure is used to transmit and receive 5G millimeter waves and serves as an antenna of a 5G product.

The packaging structure achieves an integrated package of multiple layers of antennas and a chip by encapsulating the chip layer 23 with the first antenna layer 13 and the second antenna layer 21, and then electrically connecting the chip layer 23 and the second antenna layer 21 using the redistribution layer 25 to reduce the package size.

---

In summary, in the package structure of the present disclosure and the packaging method, a carrier substrate is used, an adhesion layer, a protective layer and a first antenna layer are formed over the carrier substrate, and the first antenna layer is packaged, then a dielectric layer is formed over the first antenna layer, with a second antenna layer formed in the dielectric layer, and a chip layer is formed over a side of the dielectric layer away from the carrier substrate; the chip layer and the second antenna layer are then packaged; during the whole process of packaging the multiple layers of antennas and the chip, only one carrier substrate is used, and it is used only once, which simplifies the process, reduces the package size, and decreases the package cost. Therefore, the present disclosure effectively overcomes various shortcomings of the conventional techniques and has a high industrial value.

The above embodiments are only illustrative of the principle of the present disclosure and its efficacy, and are not intended to limit the present disclosure. Any person skilled in the art may modify or change the above embodiments without violating the spirit and scope of the present disclosure. Therefore, all equivalent modifications or alterations made by a person of ordinary knowledge in the art, for example, without departing from the spirit and technical ideas revealed by the present disclosure, shall still be covered by the claims of the present disclosure.

What is claimed is:

1. A packaging method, comprising:
forming an adhesion layer over a carrier substrate, and forming a protective layer over the adhesion layer;
forming a first antenna layer over the protective layer, wherein the first antenna layer comprises at least one first antenna unit, and forming a first conductive pillar over the first antenna unit, wherein the first conductive pillar is electrically connected to the first antenna unit;
forming a first plastic packaging layer on top of the protective layer, the first antenna layer, and the first conductive pillar, forming a dielectric layer over the first plastic packaging layer, forming a second antenna layer in the dielectric layer, and forming a second conductive pillar electrically connected to the second antenna layer;
attaching at least one chip to the dielectric layer to form a chip layer, wherein a side of the chip facing away from the carrier substrate is provided with electrodes, and forming a second plastic packaging layer on the dielectric layer, the second conductive pillar, the chip layer, and the electrodes; and
forming a redistribution layer over the second plastic packaging layer, wherein the redistribution layer comprises at least one medium layer and at least one conductive interconnection layer, and wherein the redistribution layer is electrically connected to the second conductive pillar and the electrodes, and forming conductive bumps over the redistribution layer, wherein the conductive bumps electrically connect to the conductive interconnection layer;
wherein after forming the second plastic packaging layer and before forming the redistribution layer, the method further comprises: thinning the second plastic packaging layer to reveal a top surface of the second conductive pillar.

2. The packaging method according to claim 1, wherein a material of the carrier substrate comprises one of glass, ceramic, metal, organic polymer, and semiconductor.

3. The packaging method according to claim 1, wherein after forming the first plastic packaging layer and before forming the dielectric layer, the method further comprises: thinning the first plastic packaging layer to reveal a top surface of the first conductive pillar.

4. The packaging method according to claim 1, wherein after forming the conductive bumps, the method further comprises: removing the adhesion layer and the carrier substrate to obtain an intermediate packaging structure, followed by cutting the intermediate packaging structure to obtain a plurality of final packaging structures.

5. A packaging method, comprising:
forming an adhesion layer over a carrier substrate, and forming a protective layer over the adhesion layer;
forming a first antenna layer over the protective layer, wherein the first antenna layer comprises at least one first antenna unit, and forming a first conductive pillar over the first antenna unit, wherein the first conductive pillar is electrically connected to the first antenna unit;
forming a first plastic packaging layer on top of the protective layer, the first antenna layer, and the first conductive pillar, forming a dielectric layer over the first plastic packaging layer, forming a second antenna layer in the dielectric layer, and forming a second conductive pillar electrically connected to the second antenna layer;
attaching at least one chip to the dielectric layer to form a chip layer, wherein a side of the chip facing away from the carrier substrate is provided with electrodes, and forming a second plastic packaging layer on the dielectric layer, the second conductive pillar, the chip layer, and the electrodes; and
forming a redistribution layer over the second plastic packaging layer, wherein the redistribution layer comprises at least one medium layer and at least one conductive interconnection layer, and wherein the redistribution layer is electrically connected to the second conductive pillar and the electrodes, and forming conductive bumps over the redistribution layer, wherein the conductive bumps electrically connect to the conductive interconnection layer;
wherein after forming the conductive bumps, the method further comprises: removing the adhesion layer and the carrier substrate to obtain an intermediate packaging structure, followed by cutting the intermediate packaging structure to obtain a plurality of final packaging structures.

6. The packaging method according to claim 5, wherein a material of the carrier substrate comprises one of glass, ceramic, metal, organic polymer, and semiconductor.

7. The packaging method according to claim 5, wherein after forming the first plastic packaging layer and before forming the dielectric layer, the method further comprises: thinning the first plastic packaging layer to reveal a top surface of the first conductive pillar.

8. The packaging method according to claim 5, wherein after forming the second plastic packaging layer and before forming the redistribution layer, the method further comprises: thinning the second plastic packaging layer to reveal a top surface of the second conductive pillar.

* * * * *